United States Patent [19]

Fujimura et al.

[11] Patent Number: 5,364,519
[45] Date of Patent: Nov. 15, 1994

[54] MICROWAVE PLASMA PROCESSING PROCESS AND APPARATUS

[75] Inventors: Shuzo Fujimura, Tokyo; Toshimasa Kisa, Kawasaki; Yasunari Motoki, Yokohama, all of Japan

[73] Assignee: Fujitsu Limited, Kawasaki, Japan

[21] Appl. No.: 54,609

[22] Filed: Apr. 30, 1993

Related U.S. Application Data

[63] Continuation of Ser. No. 604,343, Oct. 25, 1990, abandoned, which is a continuation of Ser. No. 532,234, Jun. 4, 1990, abandoned, which is a continuation of Ser. No. 416,002, Oct. 2, 1989, abandoned, which is a continuation of Ser. No. 150,446, Feb. 1, 1988, abandoned, which is a continuation of Ser. No. 16,513, Feb. 17, 1987, abandoned, which is a continuation of Ser. No. 802,332, Nov. 27, 1985, abandoned.

[30] Foreign Application Priority Data

Nov. 30, 1984 [JP] Japan ................ 59-252909

[51] Int. Cl.⁵ ................ C23C 16/50; H01L 21/00
[52] U.S. Cl. ................ 204/298.38; 118/723 MW; 156/345
[58] Field of Search ................ 156/345, 643, 646; 204/192.1, 192.12, 192.15, 192.32, 298.38; 118/723 MW

[56] References Cited

U.S. PATENT DOCUMENTS

| | | | |
|---|---|---|---|
| 4,101,411 | 7/1978 | Suzuki et al. | 204/298 |
| 4,245,154 | 1/1981 | Uehara et al. | 204/192 E X |
| 4,265,730 | 5/1981 | Hirose et al. | 156/345 X |
| 4,298,419 | 11/1981 | Suzuki et al. | 204/298 X |
| 4,316,791 | 2/1982 | Taillet | 204/298 |
| 4,330,384 | 5/1982 | Okudaira et al. | 204/298 X |
| 4,339,326 | 7/1982 | Hirose et al. | 204/298 |
| 4,462,863 | 7/1984 | Nishimatsu et al. | 204/298 X |
| 4,512,868 | 4/1985 | Fujimura | 204/298 |
| 4,563,240 | 1/1986 | Shibata et al. | 204/298 X |

FOREIGN PATENT DOCUMENTS 2716592 10/1977 Germany.
61-4177 2/1986 Japan.

OTHER PUBLICATIONS

European Search Report, The Hague, Feb. 10, 1988.
Kraus, John D., *Electromagentics*, 1973 pp. 482–485.

*Primary Examiner*—Nam Nguyen
*Attorney, Agent, or Firm*—Staas & Halsey

[57] ABSTRACT

A microwave plasma processing process and apparatus useful in the fabrication of integrated circuit (IC) or similar semiconductor devices, wherein the object or material to be processed, such as a semiconductor wafer, is processed with plasma generated using microwaves transmitted through a microwave transmission window disposed perpendicular to an electric field of the progressive microwaves in the waveguide.

1 Claim, 6 Drawing Sheets

MICROWAVE PLASMA PROCESSING PROCESS AND APPARATUS

This application is a continuation of application Ser. No. 07/604,343, filed Oct. 25, 1990, which is a continuation of application Ser. No. 07/532,234 filed Jun. 4, 1990, which is a continuation of Ser. No. 07/416,002 filed Oct. 2, 1989, which is a continuation of Ser. No. 07/150,446, filed Feb. 1, 1988; which is a continuation of Ser. No. 07/016,513, filed Feb. 17, 1987; and which is a continuation of Ser. No. 06/802,332, filed Nov. 27, 1985, all now abandoned.

BACKGROUND OF THE INVENTION

1. Field of the Invention

The present invention relates to a plasma processing process and apparatus useful in the fabrication of integrated circuits (ICS) or similar semiconductor devices, More particularly, the present invention relates to a microwave plasma processing method and process and an apparatus used for an etching or ashing process in the fabrication of ICS or similar devices. The present invention enables processing of a material at a higher speed by significantly reducing the reflection of microwaves.

2. Description of the Related Art

In a process for forming fine patterns in ICS or similar semiconductor devices, an etching or ashing process based on a dry process is widely used. A typical dry etching process is the plasma etching process. The plasma etching process, as compared with the wet etching process, which was frequently used at the beginning of the IC industry, has various advantages such as fine resolution and less undercutting, reduction of the number of fabricating processes by elimination of wafer handling for rinsing and drying, etc., and inherent cleanliness: Plasma etching, in particular, makes it possible to perform sequential etching and stripping operations on the same machine, making it possible to have a fully automated fabricating process for ICS or similar devices.

A "plasma" is a highly ionized gas with a nearly equal number of positive and negative charged particles plus free radicals. The free radicals are electrically neutral atoms or molecules that can actively form chemical bonds. The free radicals generated in a plasma, acting as a reactive species, chemically combine with materials to be etched to form volatile compounds which are removed from the system by an evacuating device.

Recent conventionally used plasma etching apparatuses comprise a plasma generating region (plasma generating vessel or generator) and a reacting region (reactor or etching chamber) spaced apart from each other and connected through a tube or waveguide to guide the microwaves from the plasma generating vessel to the reactor. In these apparatuses, the reactor has a microwave transmission window of silica or ceramic disposed perpendicular to the flow direction of the microwaves in the waveguide. The microwave plasma etching apparatus of the above-described structure is hereinafter referred to as a "perpendicular incidence-type plasma etching apparatus".

Examples of the perpendicular incidence-type microwave plasma etching apparatus can be found in patent literature, such as Japanese Examined Patent Publication (Kokoku) Nos. 53-14472, 53-24779, and 53-34461; Japanese Unexamined Patent Publication (Kokai) No. 53-110378, and U.S. Pat. No. 4,192,706, which is a counterpart of Japanese Examined Patent Publication (Kokoku) No. 53-14472.

In the conventional apparatuses, however, the processing rate is low as a result of the reflection of the microwaves at the two interfaces of the microwave transmission window. Further, matching of the microwaves is difficult because the microwaves are not effectively transmitted into the reactor. Furthermore, it is not easy to cool the stage for the object under processing or to reduce the size of the apparatus.

SUMMARY OF THE INVENTION

We now found that the prior art problems can be overcome if, in the microwave plasma processing process, we use microwaves transmitted through a microwave transmission window disposed perpendicular to an electric field of the progressive microwaves in the waveguide.

Accordingly, in an aspect of the present invention, there is provided a microwave plasma processing process in which the material to be processed is processed with plasma generated using microwaves transmitted through a microwave transmission window disposed perpendicular to an electric field of the progressive microwaves in the waveguide.

In another aspect of the present invention, there is provided a microwave plasma processing apparatus which includes: a microwave generator; a waveguide for the progressive microwaves connected with the microwave generator; a microwave transmission window defining a part of the waveguide disposed perpendicular to an electric field of the progressive microwaves in the waveguide; and a vacuum reactor for processing a material, the reactor being partially defined by said microwave transmission window.

In the microwave plasma processing process and apparatus of the present invention, microwaves are effectively transmitted through the microwave transmission window. Therefore, they are effectively introduced into the vacuum reactor in which plasma processing is carried out. No disturbance of the microwave mode is caused, while, as described above, the microwave transmission window is disposed perpendicular to an electric field of the microwaves, i.e., parallel to the direction of the travel of the microwaves in the waveguide.

According to the present invention, it becomes possible to process the object at a higher processing rate. Further, matching of the microwaves becomes easy. Furthermore, it becomes possible to easily cool the stage for the object and to reduce the size of the apparatus.

BRIEF DESCRIPTION OF THE DRAWINGS

Details of the present invention will be described below with reference to the accompanying drawings, in which.

DESCRIPTION OF THE PREFERRED EMBODIMENTS

Before describing the preferred embodiments, a more detailed explanation will be made of the related art, for reference.

Figure 1:
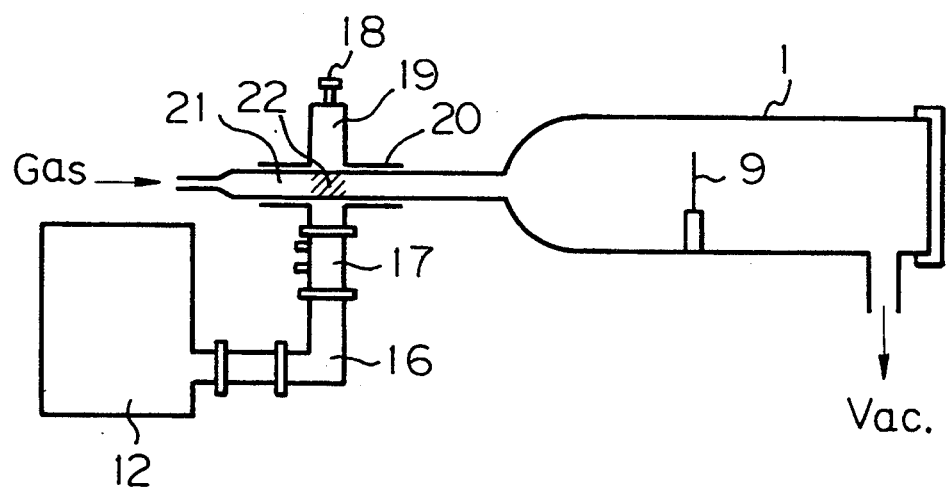
FIG. 1 is a schematic view of a prior art microwave plasma etching apparatus.

Referring to FIG. 1 which is an illustration of the plasma etching device of U.S. Pat. No. 4,192,706, a conventional microwave energy supplying device includes a magnetron power source 12, a waveguide 16, a tunnel 17, a plunger 18, an applicator 19, a microwave shield housing 20, and a plasma generating vessel 21. Descriptions of these elements are omitted because the elements are easily understood by those skilled in the art. A reactor 1 is separated from the plasma generating vessel 21 by a specified distance. This spatial separation makes it easy to obtain matching between the load impedance (plasma 22) and the output impedance of the microwave source 12 (a magnetron) at a frequency of 2.45 GHz so that the microwave energy is absorbed effectively by gas plasma 22, and the generating efficiency of an active species (radicals) is increased significantly. The radicals thus generated are introduced into a reactor 1, where a wafer 9 or other device to be processed is positioned.

Recently, in order to overcome the problems in the apparatus of the above-discussed U.S. patent, we invented an improved microwave plasma processing apparatus for removing photoresist films or etching off protective layers in the fabrication of IC semiconductor devices as well as an improved microwave plasma processing apparatus having a high processing rate and able to use various kinds of reactive gases and thus prevent damage to the IC devices being processed due to the plasma. This is set forth in U.S. Pat. No. 4,512,868 issued Apr. 23, 1985. A cross-sectional view of the preferred microwave plasma processing apparatus according to that prior invention is illustrated in FIG. 2.

Figure 2:
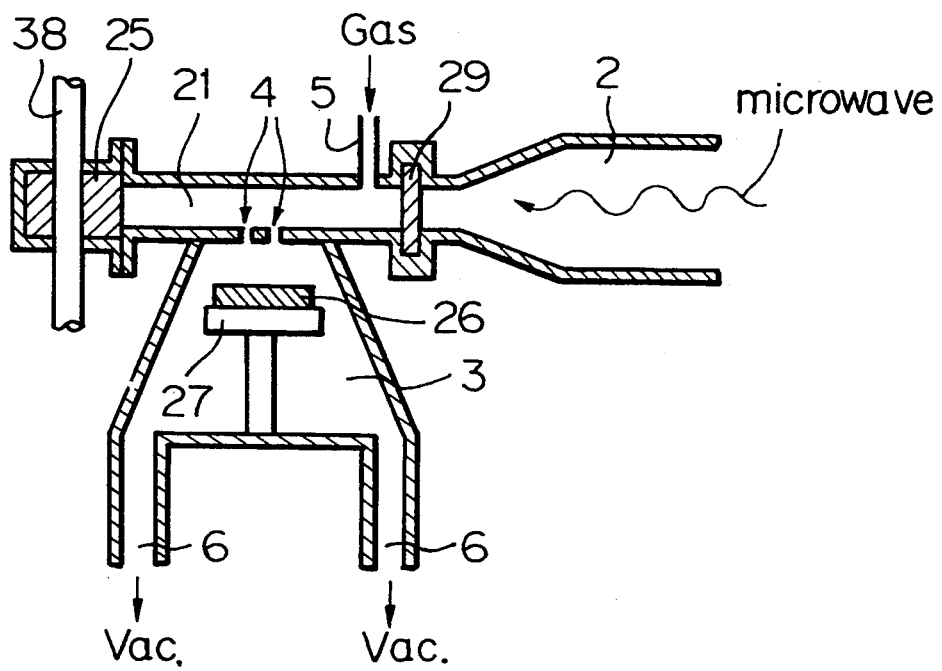
FIG. 2 is a schematic view of another prior art microwave plasma processing apparatus.

In FIG. 2, the microwave energy having a frequency of 2.45 GHz, supplied from a magnetron (not shown) having a 400 W output power, is transmitted through a waveguide 2. A plasma generating vessel 21 is substantially a part of the waveguide 2 and partitioned from the other part of the waveguide 2 by a ceramic or silica glass, vacuum tight window 29. A dummy load 25 is attached to the end of the total waveguide, namely, the waveguide 2 including the plasma generating vessel 21, in order to reduce reflected microwave power. The dummy load is water-cooled by a water-cooling pipe 38. As a result, the microwave energy applied to the reactive gas is substantially a travelling wave and ionizes the gas uniformly. A processing vessel (reactor) 3 is coupled to the plasma generating vessel 21 through several holes 4 formed in a wall of the waveguide 2. In the reactor 3, an object or material to be processed 26, such as a semiconductor wafer, is mounted on a platform or stage 27. The holes 4 act as a shielding means for the microwave energy to prevent the plasma generated in the vessel 21 from intruding into the processing vessel 3 thereby protecting the object 21 positioned inside the processing vessel 3. At the same time, the holes 4 act as a transmitting means for the radicals. The plasma generating vessel 21, the processing vessel 3, and a pumping device (not shown) comprise a vacuum system, and the system is evacuated through exhaust tubes 6. A reactive gas is introduced into the plasma generating vessel 21 through a gas feeding tube 5, and ionized to form a plasma. Radicals generated in the plasma pass through the holes 4 to reach the object 26 in the processing vessel 3 and react with the object 26 forming volatile compounds which are exhausted by the vacuum pump. The distance between the plasma generating vessel 21 and the object 26 is approximately 0.8 cm. This length of 0.8 cm is equal to the distance where the plasma may intrude if the shielding means of plasma, or transmitting means for the radicals is taken away. The dimension of the plasma generating vessel 21, in the direction of the microwave electric field, is slightly reduced from that of the original waveguide 2, by 8 mm for example. The reduction in the dimension intensifies the microwave electric field inside the plasma generating vessel 21 thereby increasing the plasma generating efficiency.

Utilizing the apparatus of FIG. 2, as described above, several plasma processing experiments were performed, using a reactive gas mixture of $O_2+CF_4$. The mixing ratio of $CF_4$ was 20% and its pressure inside the plasma generating vessel 21 was 0.5 Torr. The output power of the magnetron was 400 W. A number of silicon wafers of 4 inches in diameter having photoresist layers on them were processed, resulting in a higher ashing rate of 1.5 times that obtained with a conventional plasma processing apparatus. In this experimental processing, ashing of the photoresist layers was satisfactory. The photoresist material attached to a undercut portion or back side portion of the wafer under processing was completely removed. In addition, no damage to the wafer was found and the protection of the wafer was found satisfactory.

However, in this perpendicular incidence-type plasma etching apparatus, there are several problems. These are explained with reference to FIG. 3, which is a simplified illustration of the perpendicular incidence-type apparatus, and FIG. 4, which is an enlarged illustration of the microwave transmission window of FIG. 3.

Figure 3:
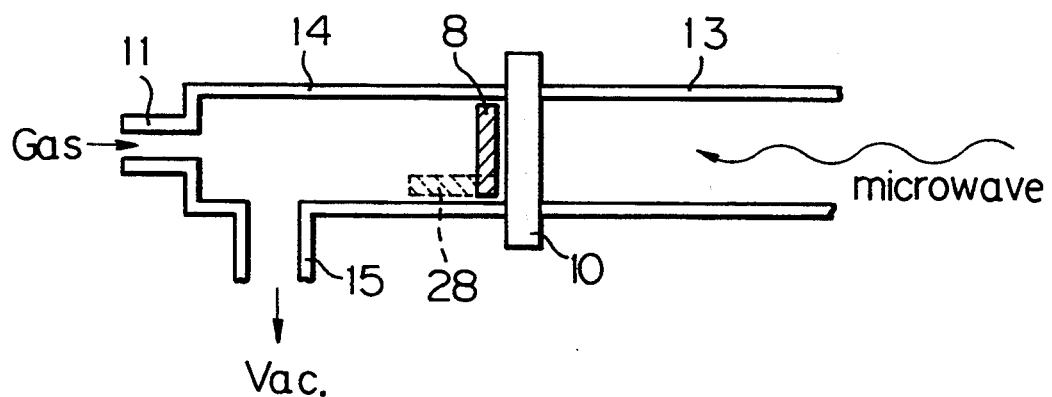
FIG. 3 is a partial schematic view of a typical prior art perpendicular incidence-type plasma etching apparatus.

As is illustrated in FIG. 3, the microwaves are guided through a waveguide 13, which is connected with a microwave power source (not shown). A reactor or etching chamber 14 is provided with a reactive gas inlet 11 and an evacuation outlet 15, connected to a conventional evacuation system (not shown) to form a vacuum in the chamber, and is connected with the waveguide 13 through a microwave transmission window 10 of silica or ceramic disposed perpendicular to the flow direction of the microwaves. An object 8 or material to be processed, such as a semiconductor wafer, is mounted on a stage (not shown; reference number 7 in FIG. 4) and is disposed in the reactor or vacuum chamber 14.

Figure 4:
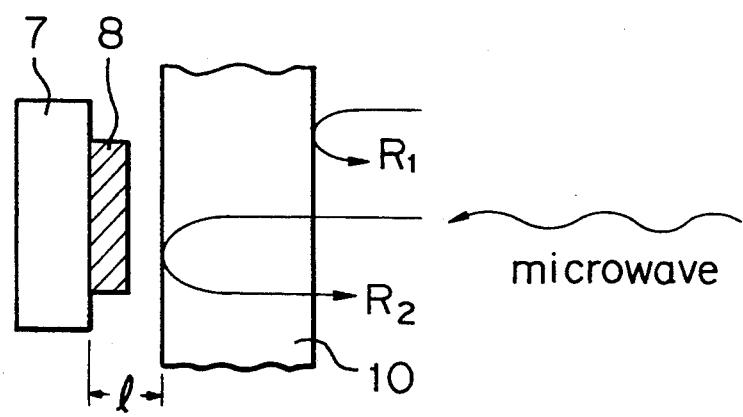
FIG. 4 is an enlarged schematic view of the microwave transmission window and object of the device shown in FIG. 3.

It is apparent from FIG. 4 that the microwaves perpendicularly incident on the microwave transmission window 10 are partially reflected at two portions. First, as is shown with an arrow $R_1$, the incident microwaves are partially reflected at an interface between the air or other atmosphere inside the waveguide and the ceramic or silica window. Second, the microwaves penetrating into the window are partially reflected at an interface between the window and the vacuum or plasma of the reactor. In addition to this, since the impedance in the reactor varies in accordance with the condition of the reactor, namely, from the vacuum to the plasma, it is substantially impossible to provide a system which results in satisfactory matching in both conditions of the vacuum and plasma.

In the illustrated apparatus, the dielectric constant ($\epsilon_1$) inside the waveguide 13 is 1, since air occupies the waveguide 13. Further, the dielectric constant ($\epsilon_3$) inside the reactor 14, before the plasma is produced therein, is 1. This is because the reactor 14 is maintained at a vacuum condition. The dielectric constant ($\epsilon_2$) of the microwave transmission window 10 depends on the type of the insulating material used. For example, the dielectric constant ($\epsilon_2$) of a silica window 10 is of the order of 3, and that of a ceramic window 10 is of the order of 9. Accordingly, in the two interfaces of the window 10 discussed above, there is a relationship of the dielectric constants $\epsilon_3 < \epsilon_2 < \epsilon_1$.

Under the above relationship of dielectric constants, in order to attain appropriate matching or minimum reflection $(R_1+R_2)$ of the microwave, it is required to control the difference in reflection $(R_1-R_2)$ so that it equals $$\frac{\lambda}{2}(2n+1),$$

wherein $\lambda$ is the wavelength of the microwaves, namely, odd times of $\lambda/2$, so that a phase shift or difference of half a wavelength or $\lambda/2$ results between the phase of $R_1$ and that of $R_2$. $R_1$ and $R_2$ were previously described. It is, therefore, conventionally carried out to adjust a thickness of the window 10 to $\lambda/4$.

The appropriate matching, however, is destroyed when the plasma is then produced in the reactor 14, whereby the relationship of the dielectric constants is changed to $\epsilon_3 > \epsilon_2 > \epsilon_1$. In this state, the maximum reflection $(R_1+R_2)$ of the microwaves is caused, as a result of the phase shift of one wavelength $\lambda$ in total. In other words, if matching is previously obtained while the reactor is under vacuum, such matching cannot be maintained during and after the plasma is produced in the reactor, because, as described above, the reflection of the microwave is increased with the production of the plasma. Further, the inappropriate matching results in unsatisfactory production of the plasma, and the sudden and large reflection of the microwaves damages the apparatus or system. In practice, it has been observed from our experiments using oxygen ($O_2$) as a reactive gas and a vacuum of 1 Torr that the reflection of the microwaves was 70% (without matching) and 30% (with matching).

Another problem is decay of the microwaves in the reactor. The microwaves incident on the reactor, when the plasma is contained in the reactor, rapidly decay upon introduction into the reactor. In addition, the density of the plasma in the reactor decreases with the decay of the microwaves. Accordingly, in order to attain uniform processing of the object or material in the plasma, it is necessary to dispose the object in the neighborhood of and parallel to the microwave transmission window. This disposition is illustrated in FIG. 3, referring to reference number 8 (the disposition of the object illustrated by reference number 28 must be avoided).

In addition, there is a problem concerning the distance between the window and the stage on which the object is supported (see the reference symbol "l" in FIG. 4). When the object has an electrical conductivity or when the stage is of a metallic material, the strength of the microwave electric field is lowest at an interface between the object and the stage. This means that, in the above instance, it becomes difficult to attain effective production of the plasma independent of the distance (l) of the stage from the window. Therefore, hereinbefore, a long distance (l) has been set so that the the stage can be positioned where the microwave electric field is maximum in strength. It has been observed that when the distance (l) is less than $\lambda/4$, no effective production of the plasma is attained, while, when the distance (l) is greater than $\lambda/4$, a remarkable decay of the plasma density at the neighborhood of the stage is caused at a pressure of 1 Torr or more. Our experiments using as a reactive gas oxygen ($O_2$), which produces radicals having a short life, indicated that no resist material was ashed at a pressure of 4 Torr and the distance (l) of 2 cm and that, at a pressure of 1 Torr and the distance (l) of 4 cm, the resist material was ashed, but its ashing rate was slow. In addition, it should be noted that the prior art generally recognizes a contradictory phenomenon that, in the ashing process of resist material using oxygen, the ashing can be attained only if the object is close to the window, while an increase of the efficiency of the plasma processing can be attained only if the distance (l) between the window and the stage is long.

Further, there are problems in connection with the disposition of the object. For example, it is difficult to dispose a cooling means for the metallic stage in the reactor and to reduce the size of the apparatus.

Figure 5:
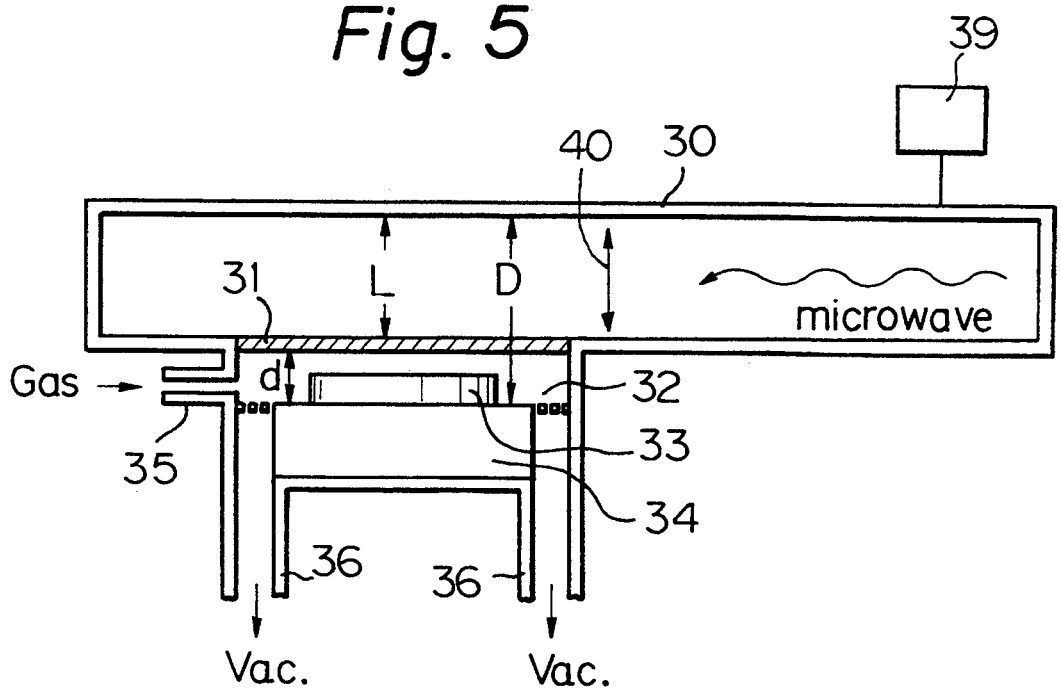
FIG. 5 is a schematic view of a microwave plasma processing apparatus according to the present invention.

An example of a microwave plasma processing apparatus according to the present invention is illustrated in FIG. 5. A waveguide is indicated with reference number 30, through which the microwave produced in a conventional microwave generator 39 is transmitted in the direction of the arrow. A microwave transmission window 31 of an insulating material such as silica or ceramic defines a part of the waveguide 30 and separates a reactor or vacuum chamber 32 from the microwave transmission region of the waveguide 30. The reactor 32, as is shown in FIG. 5, is provided with a reactive gas inlet 35, an evacuation outlet 36 connected with a conventional evacuation system (not shown), and a stage or susceptor 34 on which an object or material to processed 33, for example, a semiconductor wafer, is laid. The object 33 is disposed parallel to the window 31.

As is apparent from FIG. 5, the microwave transmission window 31 is disposed perpendicular to the direction (arrow 40) of the electric field of the progressive microwaves in the waveguide. In other words, the window 31 is parallel to the direction of the progressive microwaves. Namely, the direction of the window 31 is shifted 90° from that of the window 10 in the conventional perpendicular incidence-type plasma etching apparatus shown in FIG. 3, for example. As a result, the mode of the microwaves traveling from the waveguide 30 to the reactor 32 is not adversely affected, and the microwaves are effectively absorbed into the reactor 32. Therefore, in the illustrated plasma processing apparatus, it has been found that matching can be easily accomplished.

In order to verify the above effects, we produced a microwave plasma processing apparatus of the illustrated structure in which the microwave transmission window 31 was formed from silica and had a thickness of 12 mm. The distance (d) between the window 31 and the stage 34 was 3 mm. The distance (D) between the upper wall of the waveguide 30 and the stage 34 (a total of the height of the waveguide 30 in the direction of the electric field of the microwaves, the thickness of the window 31, and the distance (d) described above; the distance (D) hereinafter is also referred to as "chamber height") was 50 mm. The resulting apparatus was very small in comparison with the prior art perpendicular incidence-type apparatus. Microwaves having a frequency of 2.45 GHz, supplied from a microwave generator (not shown), were transmitted through the waveguide 30. Three hundred cc of oxygen gas was introduced through the inlet 35 into the reactor 32. Applying a vacuum of 0.3 Torr and an output power of 1.5 kW, plasma etching was carried out to remove the resist material on the object 33 (silicon wafer). The results gave an etching rate about five times higher than that of the prior art plasma etching process.

In connection with the above results, it has been found from our further experiments that, in the oxygen plasma etching process at a vacuum of 1 Torr, the reflection of the microwaves is 30% (70% in the prior art process) when no matching is made and 5% (30% in the prior art process) when matching is made. Such a reduction of the reflection of the microwave enables a higher etching rate.

In the illustrated apparatus of the present invention, it is easy to dispose a cooling means in the apparatus, since the lower portion of the stage 34 does not have to be maintained in a vacuum condition. In fact, according to the present invention, it is possible to carry out the plasma processing at a temperature of 100° C. or less. It should be noted that, during the plasma processing, the object 33 is generally heated to a higher temperature exceeding 200° C. if the apparatus has no cooling means.

In the practice of the present invention, it is preferred that the dimensions of the object or material to be processed be smaller than those of the microwave transmission window. This is because, when the microwaves transmitted through the window are incident on the material they must cover all of the material. This enables uniform plasma processing under limited plasma generating conditions.

Moreover, the distance or chamber height (D) discussed above is preferred to be less than $\lambda/2$, wherein $\lambda$ is the wavelength of the microwaves. It has been found that such a chamber height results in reduction of the deflection of the reflected wave in the presence of the plasma, thereby extending the possible matching range. Further, when the chamber height (D) is less than $\lambda/2$, a tuning operation can be easily carried out.

Further, while not illustrated in any of the accompanying drawings, it is preferred that the microwave transmission window be supported with a holder which is fitted to the waveguide and be replaceable. If the window is replaceable, it is easy to change the size and material of the window depending upon the conditions of the plasma processing. Further, an apparatus of this structure can be commonly used for both plasma processing and after-glow discharge processing, for example. This means that the apparatus of the present invention can be widely used in various different processes.

Figure 6:
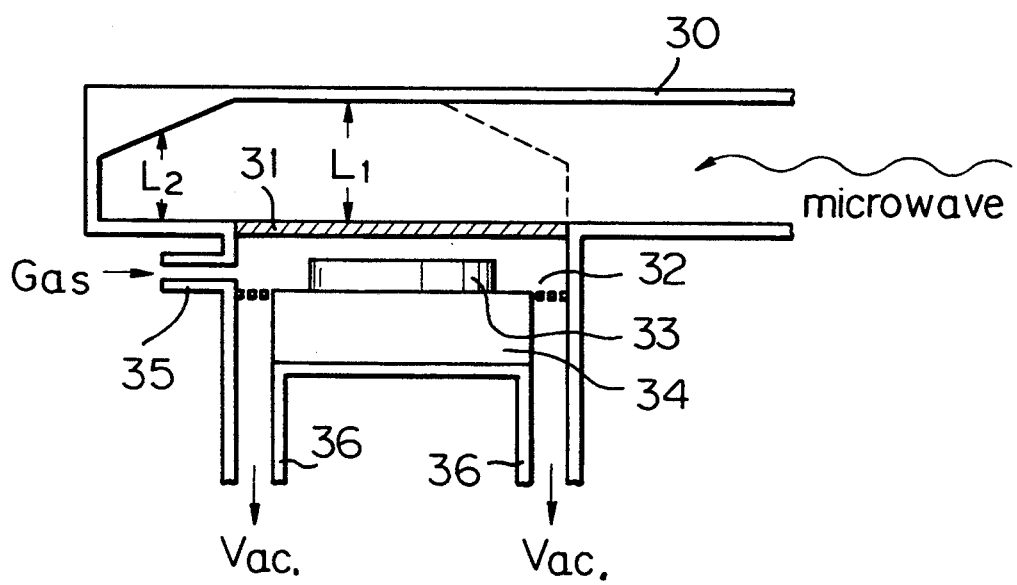
FIG. 6 is a schematic view of another microwave plasma processing apparatus according to the present invention.
Figure 7:
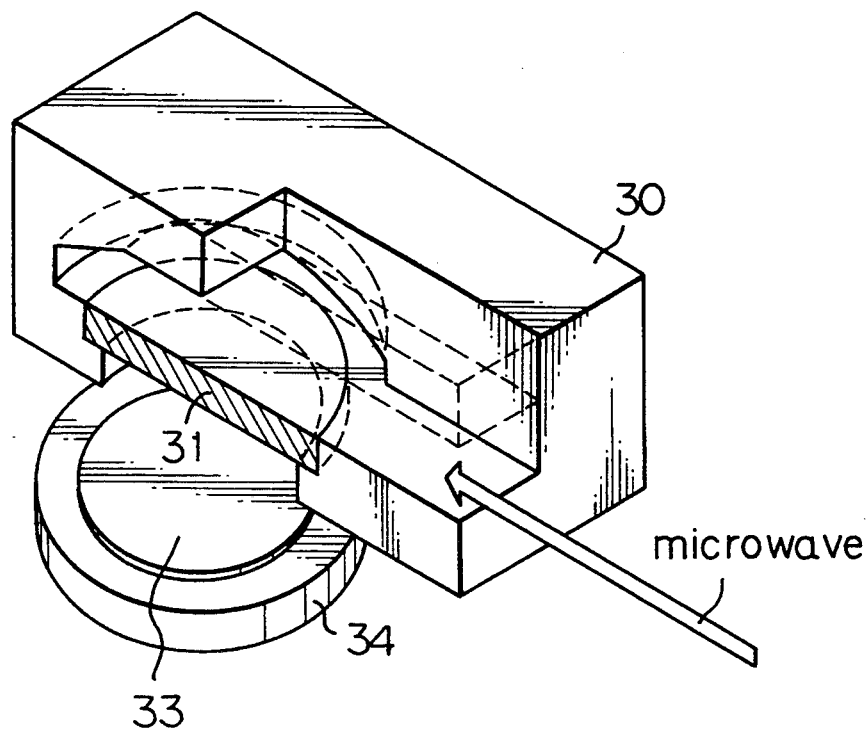
FIG. 7 is a perspective view of the plasma processing apparatus shown in FIG. 6.

FIG. 6 illustrates an embodiment of the apparatus according to the present invention. As is illustrated, the height (L in FIG. 5) of the waveguide 30 in the direction of the electric field of the microwaves is decreased in the direction of travel of the microwaves. For example, the height ($L_2$) is smaller than the height ($L_1$). FIG. 7 is a perspective view of the apparatus shown in FIG. 6.

Figure 8:
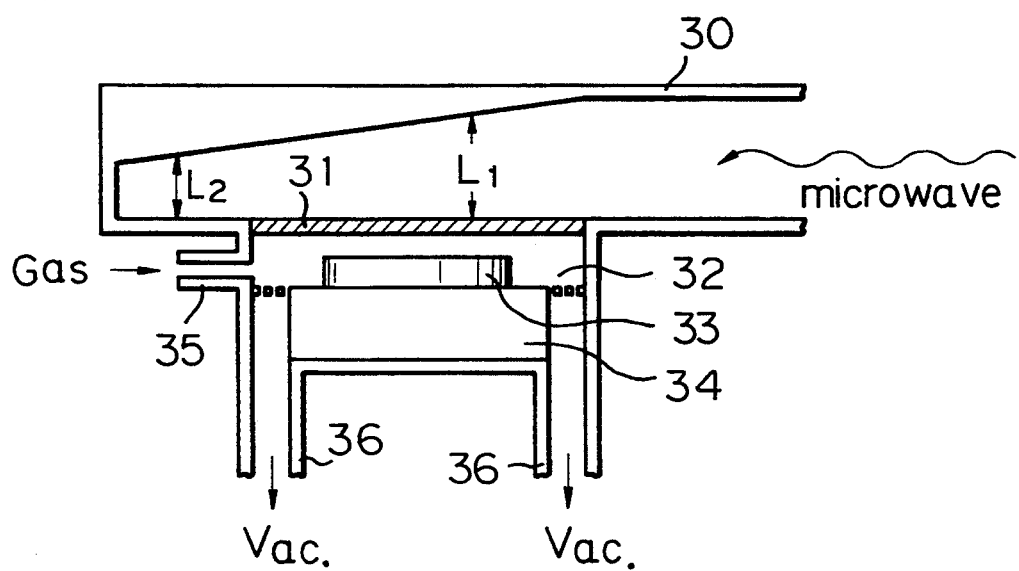
FIG. 8 is a schematic view of still another microwave plasma processing apparatus according to the present invention.
Figure 9:
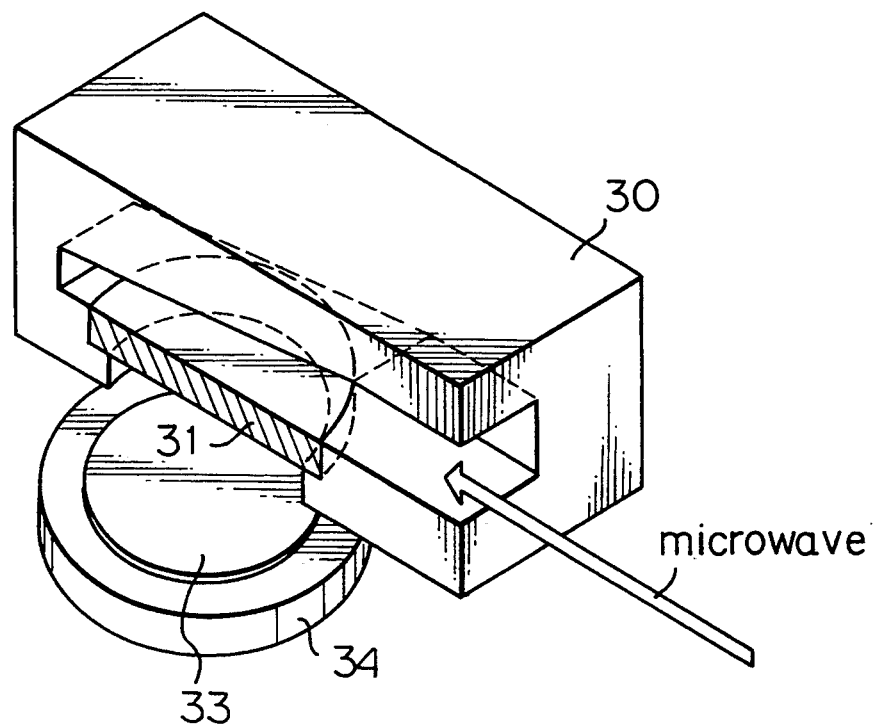
FIG. 9 is a perspective view of the plasma processing apparatus shown in FIG. 8.

Similarly, in the apparatus of FIG. 8, which is a modification of the apparatus of FIG. 6, the height of the waveguide is gradually decreased so that the height ($L_2$) of the waveguide 30 is smaller than the height ($L_1$) of the same. FIG. 9 is a perspective view of the apparatus shown in FIG. 8.

In any case, when the height of the waveguide 30 is gradually decreased in the manner shown, for example, in FIGS. 6 to 9, it effectively compensates for the loss of the strength of the electric field at an end portion of the waveguide 30. As a result of the decrease of the waveguide height, a constant distribution of the strength of the electric field in the waveguide 30 is provided, and reduction of the reflection of the microwaves therefore results. For example, we could reduce the reflection power of the processing apparatus using an incident power of 1500 W from 400 W (prior art) to 150 W (present invention).

Figure 10:
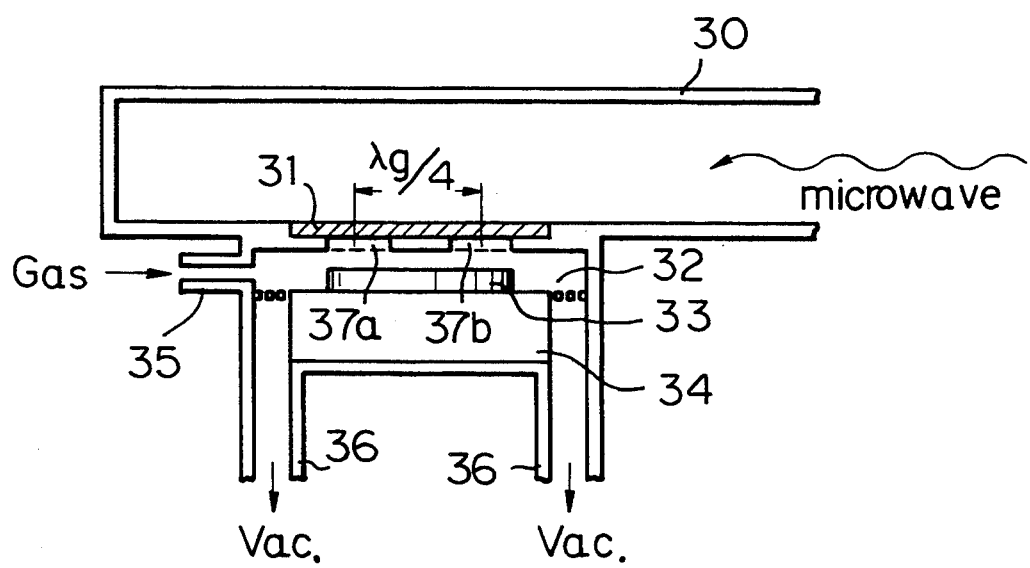
FIG. 10 is a schematic view of still another microwave plasma processing apparatus according to the present invention.
Figure 11:
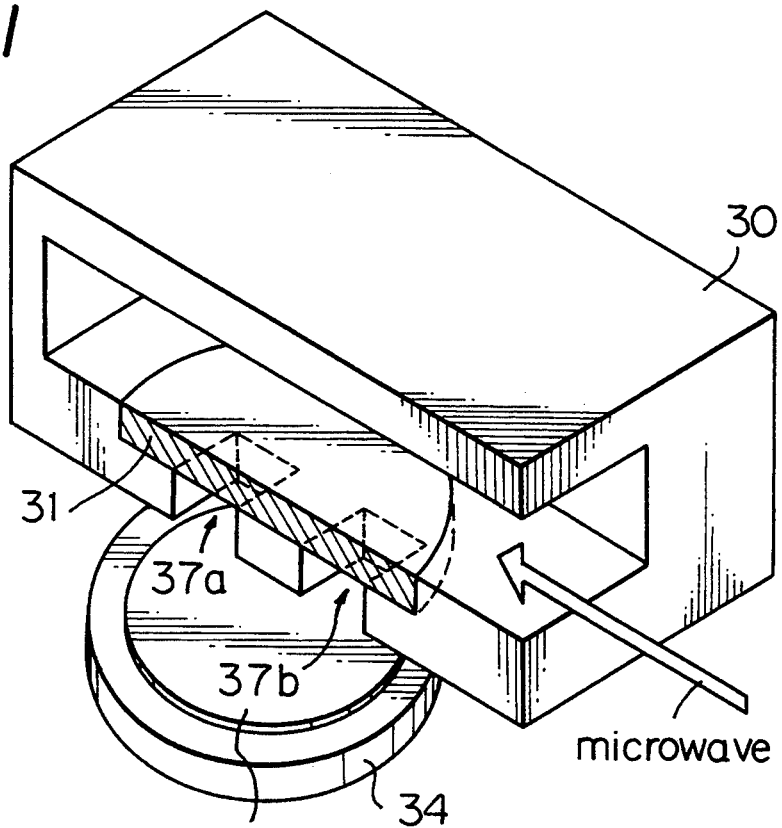
FIG. 11 is a perspective view of the plasma processing apparatus shown in FIG. 10.

In the practice of the present invention, the microwave transmission window generally comprises a disc-shaped element of an insulating material such as silica or ceramic. However, as an alternative, it may comprises two or more rectangular, for example, stripe-shaped, elements which are parallel to each other, the distance between the two adjacent elements being $\lambda g/4$, wherein $\lambda g$ is the wavelength of the microwaves in the waveguide. See FIG. 10. FIG. 11 is a perspective view of the apparatus of FIG. 10, in which 37a and 37b are notches. The separation of the window into two or more elements in the illustrated manner is effective to prevent the breakage of the window without narrowing the plasma area, when a window of a weak material such as alumina is subjected to atmospheric pressure. This is because the openings 37a and 37b act as an additional waveguide.

Figure 12:
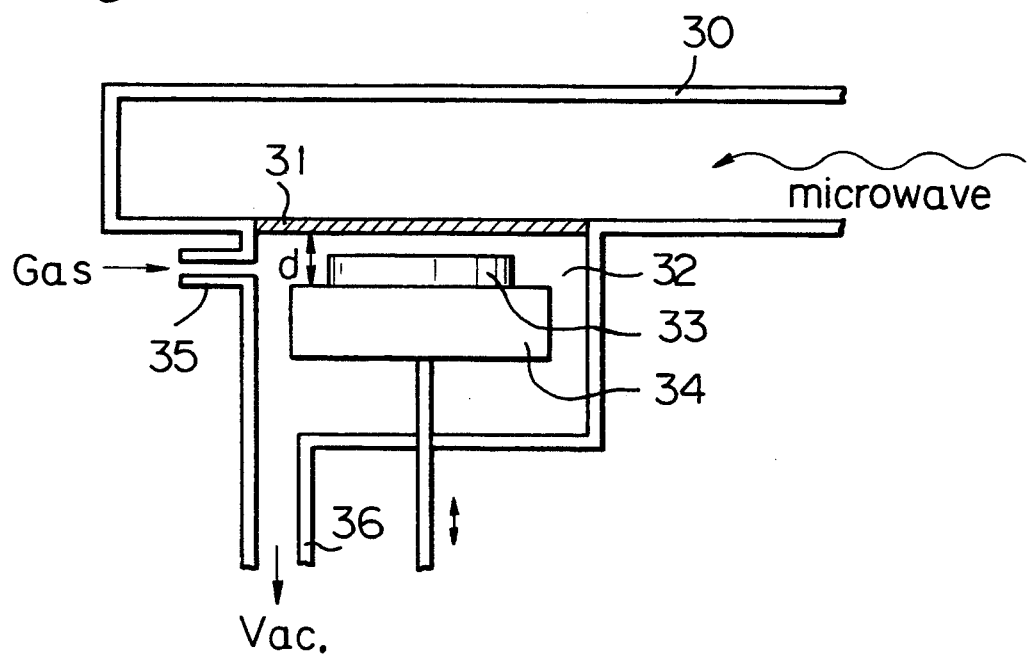
FIG. 12 is a schematic view of still another microwave processing apparatus according to the present invention.

Finally, FIG. 12 shows that a stage 34 reciprocatable in the direction of the electric field of the progressive microwaves in the waveguide 30. The reciprocatable stage 34 is effective to control the distance (d) between the window 31 and the stage 34 depending upon various factors, such as conditions of the object 33 or the objects of the processing, thereby preventing damage of the object 33. It has been found that, in oxygen plasma processing for removing resist material from an aluminum substrate, at 0.3 Torr, the aluminum substrate was damaged at a distance (d) of 5 mm, but was not damaged at a distance (d) of 20 mm.

We claim:

1. A microwave plasma processing apparatus for processing a material, comprising:
   a reaction gas source for supplying a reaction gas;
   a microwave generator generating microwaves having a wavelength $\lambda$;

a waveguide, connected with said microwave generator, having a rectangular prism shape with a longitudinal axis and side-walls extending in parallel to the longitudinal axis, said waveguide receiving the microwaves propagating in a first direction parallel to the side-walls and for transferring the microwaves along the longitudinal axis of said waveguide;

a dielectric window, formed of at least two rectangular elements parallel to each other, superposed over an opening in a first side-wall of said waveguide, for transmitting the microwaves therethrough to an exterior surface thereof, the distance between the two rectangular elements being $\lambda g/4$, where $\lambda g$ is a wavelength of the microwaves in the waveguide;

a plasma processing chamber connected to said reaction gas source and formed adjacent to the first side-wall of said waveguide to entirely enclose the exterior surface of said dielectric window, said plasma processing chamber offset on the exterior of said waveguide from the first side-wall of said waveguide in a second direction perpendicular to the longitudinal axis of said waveguide, said plasma processing chamber receiving the microwaves transmitted through said dielectric window and the reaction gas supplied from said reaction gas source to generate plasma therein; and a stage for holding the material to be processed thereon, said stage disposed in said plasma processing chamber with a top surface of said stage substantially in parallel with said dielectric window.

* * * * *